(12) United States Patent
Erdogan et al.

(10) Patent No.: US 8,575,988 B2
(45) Date of Patent: Nov. 5, 2013

(54) MIXED-SIGNAL INTEGRATOR ARCHITECTURE

(75) Inventors: Ozan E. Erdogan, Sunnyvale, CA (US);
Guozhong Shen, San Jose, CA (US);
Rajesh Anantharaman, San Jose, CA (US); Ajay Taparia, Santa Clara, CA (US); Behrooz Javid, Irvine, CA (US);
Syed T. Mahmud, Dublin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/404,722

(22) Filed: Feb. 24, 2012

(65) Prior Publication Data

US 2012/0274404 A1    Nov. 1, 2012

Related U.S. Application Data

(60) Provisional application No. 61/446,944, filed on Feb. 25, 2011.

(51) Int. Cl.
*H03K 5/00* (2006.01)
(52) U.S. Cl.
USPC .......................... 327/336; 327/554; 327/558

(58) Field of Classification Search
USPC .................... 327/551–559, 336–337
See application file for complete search history.

(56) References Cited

U.S. PATENT DOCUMENTS

| | | | | |
|---|---|---|---|---|
| 4,567,465 A * | 1/1986 | Komiya | ......................... | 341/168 |
| 4,816,745 A * | 3/1989 | Schneider | ...................... | 324/704 |
| 6,493,404 B1 * | 12/2002 | Iizuka et al. | ................... | 375/343 |
| 8,354,991 B2 * | 1/2013 | Brown | .......................... | 345/101 |
| 2012/0218020 A1 | 8/2012 | Erdogan et al. | | |
| 2012/0218223 A1 | 8/2012 | Erdogan et al. | | |

* cited by examiner

*Primary Examiner* — Dinh T. Le

(57) ABSTRACT

A mixed signal correlator utilizes coherent detection within a capacitance measurement application. In some applications, the mixed signal correlator is used to measure capacitance of a touch screen display. An external capacitor whose capacitance is measured is kept small for improved sensitivity and can be used for a variety of applications having varied integration periods for measurement. The external capacitor is kept small and can be used for varied applications by adjusting the output voltage within a range that is less than the supply voltage, and maintaining a count of the adjustments to later reconstruct an actual output voltage for the integration period. An output is a weighted sum of an analog integrator output and a digital counter output.

22 Claims, 10 Drawing Sheets

MIXED-SIGNAL INTEGRATOR ARCHITECTURE

RELATED APPLICATIONS

This application claims priority of U.S. provisional application Ser. No. 61/446,944, filed Feb. 25, 2011, and entitled "Mutual Capacitance Touch-Screen Controller IIC Interface", by these same inventors. This application incorporates U.S. provisional application Ser. No. 61/446,944 in its entirety by reference.

This application is related to U.S. Patent Application Publication No. 2012/0218020 (U.S. Ser. No. 13/404,817 filed on Feb. 24, 2012) and U.S. Patent Application Publication No. 2012/0218223 (U.S. Ser. No. 13/404,594 filed on Feb. 24, 2012), both of which claim the benefit of U.S. Provisional Application No. 61/446,944 filed on Feb. 25, 2011. The disclosure of the above applications are incorporated herein by reference in their entirety.

FIELD OF THE INVENTION

This invention relates to analog front end circuits for converting measured capacitances to voltages. More specifically, this invention relates to analog front end circuits having a mixed-signal correlator or a mixed-signal integrator for demodulating a measured capacitance from an excitation signal.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A resistive touchscreen panel is composed of several layers including two thin metallic electrically conductive and resistive layers separated by thin space. When some object touches the touchscreen panel, the layers are connected at certain point. In response to the object contact, the panel electrically acts similar to two voltage dividers with connected outputs. This causes a change in the electrical current that is registered as a touch event and sent to the controller for processing.

A capacitive touchscreen panel is coated, partially coated, or patterned with a material that conducts a continuous electrical current across a sensor. The sensor exhibits a precisely controlled field of stored electrons in both the horizontal and vertical axes to achieve capacitance. The human body is conductive; therefore, influences electric fields stored in a capacitance. When a reference capacitance of the sensor is altered by another capacitance field, such as a finger, electronic circuits located at each corner of the panel measure the resultant distortion in the reference capacitance. The measured information related to the touch event is sent to the controller for mathematical processing. Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

FIG. 1 illustrates an exemplary conventional capacitive touch sensor used in a capacitive touchscreen panel. Such sensors are typically formed using transparent conductors, such as ITO (Indium Tin Oxide) conductors, formed in layers. In the exemplary configuration of FIG. 1, bottom conductors form drive electrodes X0, X1, X2, X3, also referred to as drive lines, and top conductors form sense electrodes Y0, Y1, Y2, Y3, also referred to as sense lines. Each cross-point of a drive line and a sense line forms a capacitor having a measured capacitance Cm. The objective is to determine an estimate of a touch position on the capacitive touch sensor. When a finger, or other object that is grounded, is positioned on or proximate a cross-point of the sensor, there is a change in the measured capacitance Cm at that cross-point. The measured capacitance Cm is the capacitance between the sense line and the drive line at the cross-point. When the touch event occurs at the cross-point, a portion of the field lines between the sense line and the drive line are diverted to between the sense line and the finger. As such the measured capacitance Cm decreases during a touch event.

An analog front end (AFE) circuit performs signal processing on an analog signal and typically performs an analog-to-digital conversion. Analog front end circuits can be used in a variety of applications, including measuring and converting a capacitance to a corresponding voltage. FIGS. 2A and 2B illustrate a simplified schematic block diagram of a conventional analog front end circuit used for measuring a capacitance of an external capacitor and converting the measured capacitance to a corresponding voltage. In an exemplary application, the external capacitance is the charge stored in the capacitor Cm of FIG. 1. FIG. 2A illustrates the circuit in a first phase, and FIG. 2B illustrates the circuit in a second phase. During phase 1, charge to be measured is collected on the capacitor Cm. During phase 2, the charge stored on the capacitor Cm is transferred to the capacitor Cf and a corresponding voltage Vout is output.

Referring to FIG. 2A, the circuit includes the capacitor Cm, an operational amplifier 2, a switch 4, a feedback capacitor Cf, and a switch 6. A voltage at the negative input of the amplifier 2, and therefore at a first terminal of the capacitor Cm, is a virtual ground, Vvg. During phase 1, the switch 4 is connected to the reference voltage Vref, and the switch 6 is closed. Closing the switch 6 enables the capacitor Cf to completely discharge to a known zero state. The charge across the capacitor Cm is Vvg-Vref times the capacitance Cm.

During phase 2, the switch 4 is connected to ground, and the switch 6 is opened, as shown in FIG. 2B. With the switch 4 connected to ground the voltage across the capacitor Cm is zero, and all the charge on the capacitor Cm is transferred to the capacitor Cf. The output voltage Vout is a signal with amplitude dependent on the charge stored on the capacitor Cm and transferred to the capacitor Cf. The output voltage Vout can be input to an analog-to-digital converter (ADC), such as in FIG. 4, to be converted to a corresponding digital output value. Since the capacitor Cf was completely discharged during phase 1, the charge stored on capacitor Cf is determined entirely by the amount of charge transferred from the capacitor Cm. If the capacitor Cf is not completely discharged to a zero state during phase 1, then the capacitor Cf will retain the memory of its previous state.

The output voltage Vout=Vref*Cm/Cf+vn, where Vref is a known internal reference value, vn is the undesired noise measured by the system, and Cf is a known value. As such, the capacitance Cm can be determined from the known values Vref and Cf and the measured value Vout. The capacitance Cm is a varying capacitance and represents the capacitance to be measured, such as the measured capacitance of a touch screen display. As a finger touches the touch screen display, the capacitance changes, which is the external capacitance change being measured.

A problem with the circuit of FIGS. 2A and 2B relates to wide-band noise sampling. The circuit does not include any noise filtering, so any noise introduced into the system at the transition from phase 1 to phase 2 is included within the charge transferred to the capacitor Cf. This noise is represented as the component "vn" in the output voltage Vout. So not only is the output voltage Vout a measure of the capacitance Cm, but also an instantaneous sampling of the noise. Further, the dynamic range of the ADC needs to be large enough to account for the increased magnitude of the output voltage Vout due to noise. The larger dynamic range results in an ADC that has a larger area and uses more power.

FIG. 3 illustrates exemplary response curves for the circuit of FIGS. 2A and 2B. The top curve shows a sampling clock corresponding to phase 1 and phase 2. When the sample clock is high, e.g. 1V, the circuit is in phase 1 (FIG. 1), and when the sample clock is low, e.g. 0V, the circuit is in phase 2 (FIG. 2). In an exemplary application, the input is sampled on the rising edge of the sampling clock. The moment that the switches 4 and 6 are changed from phase 2 to phase 1 the voltage Vout is sampled. As shown in the middle curve of FIG. 3, there is some noise on the input signal, but its average value is substantially constant. The sampled value is expected to be constant, such as 1V, but due to the noise the actual sampled output varies about the expected constant value depending on the instantaneous noise present at the sampling time. An example of this variation on the actual sampled output is shown in the bottom curve of FIG. 3. If the instantaneous noise is high, then the actual sampled output is greater than the expected constant value, such as the portions of the sampled output curve that are above 1V. If the instantaneous noise is low, then the actual sampled output is lower than the expected constant value, such as the portions of the sampled output curve that are below 1V.

In application, a threshold voltage for determining a change in capacitance, such as a touch event on a touch screen display, is increased to accommodate the variation in the sampled output. Increasing the threshold voltage reduces the sensitivity of the system. Using a threshold voltage that is too low to account for the noise variations results in false triggers.

Various alternative systems that measure a capacitance include considerations for the noise. FIG. 4 illustrates a simplified schematic block diagram of a conventional analog front end circuit using digital filtering. The circuit of FIG. 4 includes an analog-to-digital converter (ADC) connected to the output of the low-noise amplifier (LNA). Voltage input to the ADC is converted to a digital value, which is processed by digital processing circuitry that includes noise filtering. The ADC is also a sampling system which samples at a single instant in time. This results in similar varying sampled output values as described above in relation to FIG. 3.

FIG. 5 illustrates a simplified schematic block diagram of another conventional analog front end circuit. The circuit of FIG. 5 is the same as the circuit of FIG. 4 with the addition of a band-pass filter (BPF) to filter the signal prior to inputting to the ADC. The BPF attempts to filter the noise present in the voltage signal (middle curve of FIG. 3) prior to inputting to the ADC. Sampling is performed on the filtered signal output from the BPF. The problem with the circuit of FIG. 5 is that different applications are subjected to different noise spectrums. As such, the BPF cannot be fixed, instead the BPF must be tunable to the specific application. Also, the BPF should be able to be finely tuned to accommodate applications with a relatively narrow frequency response. For example, a touch screen display may have a frequency response between about 50-400 kHz. If the BPF has too large a bandwidth, such as 50 kHz, the filter bandwidth may be too wide to effectively filter noise for certain applications.

SUMMARY OF THE INVENTION

A mixed signal correlator utilizes coherent detection within a capacitance measurement application. In some applications, the mixed signal correlator is used to measure an external capacitance, such as that of a touch screen display. The correlator capacitance is kept small for improved sensitivity and can be used for a variety of applications having varied integration periods for measurement. The correlator capacitance is kept small and can be used for varied applications by adjusting the output voltage within a range that is less than the supply voltage, and maintaining a count of the adjustments to later reconstruct an actual output voltage for the integration period. An output is a weighted sum of an analog integrator output and a digital counter output.

In an aspect, an integration circuit is disclosed. The integration circuit includes a resistive element, an amplifier, an integrating feedback capacitor, a voltage adjustment circuit, and a logic circuit. The resistive element is configured to receive an input voltage signal. The amplifier is coupled to an output of the resistive element. The integrating feedback capacitor is coupled to an input of the amplifier and to an output of the amplifier. The voltage adjustment circuit is coupled to the input of the amplifier, wherein the voltage adjustment circuit is configured to adjust an output voltage at the output of the amplifier by a voltage adjustment if the output voltage reaches one or more defined limits. The logic circuit is coupled to the voltage adjustment circuit, wherein the logic circuit is configured to control the voltage adjustment circuit and to count a number of voltage adjustments implemented by the voltage adjustment circuit during an integration time period.

Each adjustment of the output voltage can be a fixed adjustment voltage Vj. The one or more defined limits can include a threshold high voltage Vth and a threshold low voltage Vtl. The adjustment voltage Vj can be a positive value if the output voltage decreases to the threshold low voltage Vtl, and the adjustment voltage Vj can be a negative value if the output voltage increases to the threshold high voltage Vth. The integration circuit can also include an analog-to-digital convertor coupled to the output of the amplifier to convert the output voltage to a digital value at each integration time period. The integration circuit can also include a multiplication circuit coupled to the logic circuit, wherein the multiplication circuit receives a first input comprising the count of the number of voltage adjustments and a second input comprising a digital representation of the fixed adjustment voltage Vj, and the multiplication circuit outputs a product of the two inputs. The integration circuit can also include a summing circuit coupled to the analog-to-digital converter and to the multiplication circuit, wherein the summing circuit is configured to add the digital value output from the analog-to-digital converter and the product output from the multiplication circuit to generate a reconstructed voltage output for the integration time period. A size of the integrating feedback capacitor can be independent of the integration time period such that the integration time period is decoupled from an RC time constant of the integration circuit. The integration circuit can also include a comparison circuit coupled to the integrating feedback capacitor, the amplifier, and the logic circuit, wherein the comparison circuit is configured to receive the output voltage, to compare the output voltage to the one or more defined limits, and to output a comparison result to the logic circuit. The logic circuit can include program instructions configured to perform the steps of comparing the output voltage to the one or more defined limits, and to control the voltage adjustment circuit according to a comparison result. The voltage adjustment circuit can include a charge dump capacitor and a plurality of switches, wherein the charge dump capacitor is coupled to the integrating feedback capacitor via a first switch of the plurality of switches, and the plurality of switches are coupled to the logic circuit. The resistive element can have a fixed impedance. The resistive element can have a time-varying impedance.

In another aspect, a method of integrating an output voltage is disclosed. The method includes integrating a charge on a capacitor included in an integrator and outputting an instantaneous integrated output voltage according to a current charge accumulated by the capacitor. The method also includes comparing the instantaneous integrated output voltage to one or more threshold values to determine if the instantaneous integrated output voltage is within a voltage range. The method also includes adjusting the charge on the capacitor if the instantaneous integrated output voltage is not within the voltage range, thereby maintaining the instantaneous integrated output voltage within a voltage range. The method also includes determining an accumulated voltage change corresponding to all increases and decreases in charge applied within an integrating period. The method also includes determining a total integration voltage over the integrating period by adding the accumulated voltage change to the instantaneous integrated output voltage at the end of the integrating period.

Adjusting the charge can include decreasing the charge on the capacitor if the instantaneous integrated output voltage is greater than or equal to a high threshold value, and increasing the charge on the capacitor if the instantaneous integrated output voltage is less than or equal to a low threshold voltage, wherein decreasing the charge on the capacitor decreases the instantaneous integrated output voltage and increasing the charge on the capacitor increases the instantaneous integrated output voltage. The charge can be continuously integrated by the capacitor during the integrating period. The integrating period can be decoupled from an RC time constant of the integrator. Comparing the instantaneous integrated output voltage to one or more threshold values can be performed in software. Comparing the instantaneous integrated output voltage to one or more threshold values can be performed using one or more comparators. Adjusting the charge on the capacitor can result in adjusting the instantaneous integrated output voltage. Each adjustment of the instantaneous integrated output voltage can be a fixed adjustment voltage $V_j$. The one or more threshold values can includes a threshold high voltage $V_{th}$ and a threshold low voltage $V_{tl}$. The adjustment voltage $V_j$ can be a positive value if the output voltage decreases to the threshold low voltage $V_{tl}$, and the adjustment voltage $V_j$ can be a negative value if the output voltage increases to the threshold high voltage $V_{th}$. Determining the total integration voltage can include converting the instantaneous integrated output voltage to a digital value at each integration time period and adding the accumulated voltage change to the digital value.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a mixed signal correlator. Those of ordinary skill in the art will realize that the following detailed description of the mixed signal correlator is illustrative only and is not intended to be in any way limiting. Other embodiments of the mixed signal correlator will readily suggest themselves to such skilled persons having the benefit of this disclosure.

Reference will now be made in detail to implementations of the mixed signal correlator as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 6:
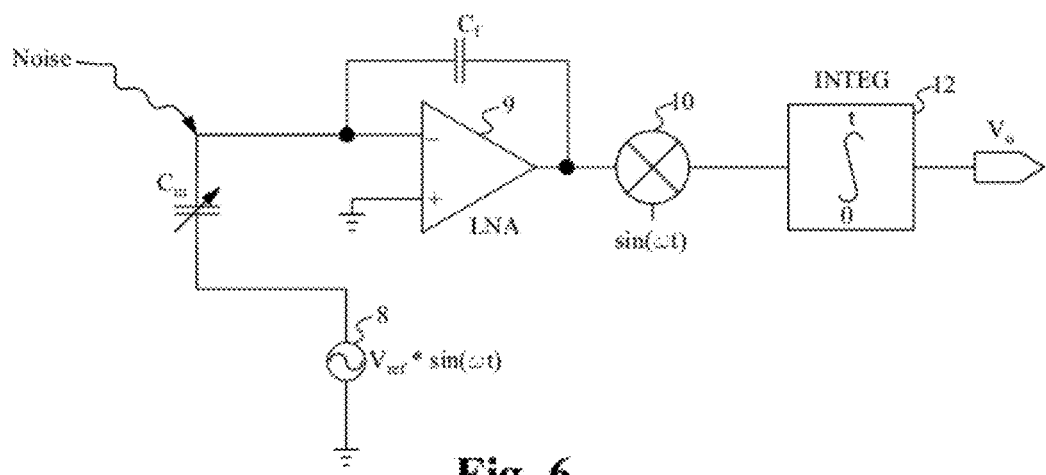
FIG. 6 illustrates a simplified schematic block diagram of an analog front end circuit using coherent detection according to a first embodiment.

In some embodiments, a capacitance measurement is performed by an analog front end circuit that uses coherent detection, also referred to as synchronous demodulation or correlation, to reject noise and/or other interferers. FIG. 6 illustrates a simplified schematic block diagram of an analog front end circuit using coherent detection according to a first embodiment. Coherent detection generally refers to transmitting a signal at a certain frequency f, and detecting the signal at that same frequency f. Signals at other frequencies are considered noise. A mixer 10 and an integrator 12 are together referred to as a correlator, which performs synchronous demodulation, or correlation, to reject noise and/or interferers. In some embodiments, a mixer includes an operational amplifier and a resistor pair including a variable resistor, where an output voltage of the mixer is a function of the input voltage multiplied by the ratio of the two resistors. In some embodiments, an integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Alternatively, other conventional mixer and integrator configurations can be used.

A signal generator 8 generates an excitation signal sin(ωt), where ω=2πf. The excitation signal sin(ωt) is multiplied by a reference voltage Vref. The resulting signal Vref*sin(ωt) is modulated according to a measured capacitance of the capacitor Cm. This modulated signal is amplified by a low-noise amplifier 9, input to the mixer 10 and mixed with the original excitation signal sin(ωt). The mixer 10 multiples the two input signals, the modulated and amplified excitation signal and the excitation signal. The multiplied signals are then integrated over a time period T by the integrator 12. The time period T is a multiple of the period 1/f. Multiplying the two sine wave signals results in a DC voltage term (Cm/2Cf) Vref plus a sine term at twice the frequency, which when integrated over a multiple of the frequency cancels out, leaving only the DC voltage term. This is the result when only an ideal signal is present. When noise is introduced, the noise is also multiplied by the excitation signal sin(ωt) and integrated. The output voltage Vout can be represented as follows:

$$V_{out} = \frac{C_m}{2C_f} V_{ref} + \int_0^T n(t)\sin(2\pi f t)dt \quad (1)$$

where T is a multiple of 1/f and the noise is represented as n(t). The integrator 12 provides a band-pass filtering function with a peak around f so that the noise, included in the second term in equation (1), is filtered out. The output voltage Vout is the DC voltage term that can be subsequently sampled using an ADC. There is no dynamic signal to be sampled.

Figure 7:
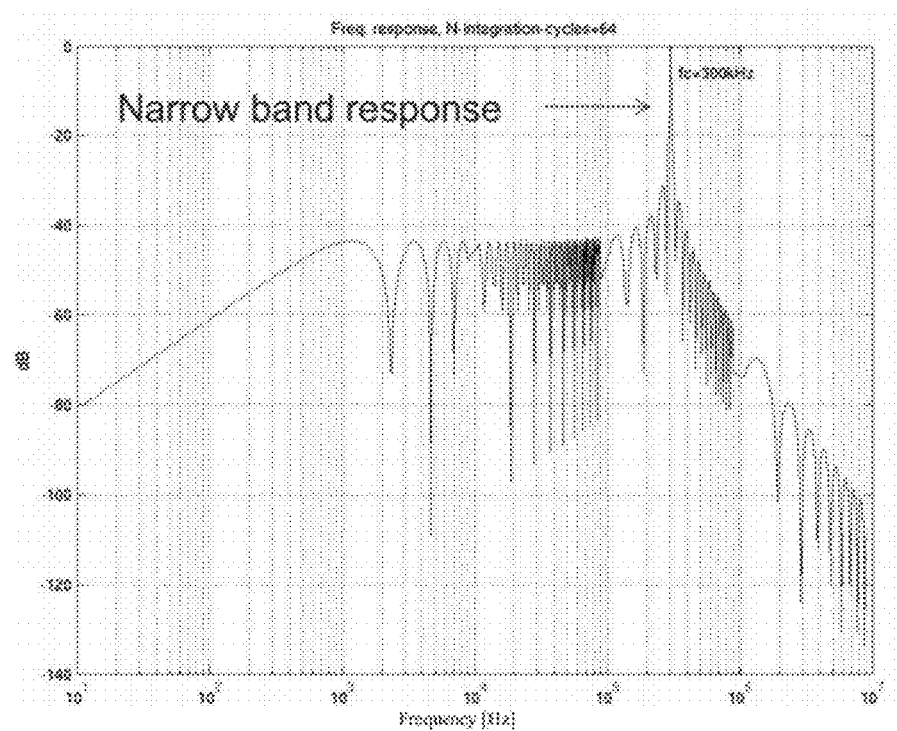
FIG. 7 illustrates an exemplary frequency response of the circuit of FIG. 6 for an excitation frequency f equal to 300 kHz.

FIG. 7 illustrates an exemplary frequency response of the circuit of FIG. 6 for an excitation frequency f equal to 300 kHz. In an exemplary application, the circuit of FIG. 6 is configured for narrow band pass filtering, and the corresponding narrow band frequency response of FIG. 7 shows that the circuit is very selective about 300 kHz. Other frequencies are filtered out.

In addition to filtering out the noise, the coherent detection circuit shown in FIG. 6 can also be easily adapted to generate excitation signals of alternate frequencies so as change the band-pass function. This tuning does not require changing the LNA, the mixer 10, or the integrator 12. The signal generator 8 is simply changed to generate the excitation signal at the alternate frequency. In contrast, the BPF component in the conventional analog front end circuit in FIG. 5, e.g. the resistors and capacitors within the BPF, need to be adjusted to change the band-pass function.

Although the above application is described above in terms of sine waves, it is understood that other waveforms can be used to apply coherent detection. Equation (1) can be generalized to:

$$V_0 = \int_0^T E(t)C(t)dt + \int_0^T n(t)C(t)dt \quad (2)$$

where E(t) is an excitation signal supplied to the capacitor Cm and C(t) is a correlation signal input to the mixer. E(t) and C(t) can be any waveform such that E(t) and C(t) are correlated. E(t) and C(t) are chosen such that the integration of E(t)C(t) is maximized and the integration of n(t)C(t) is minimized. C(t) is selected for least correlation to noise. The time period T is a multiple of the E(t)*C(t) period.

Implementation of the mixer 10 is a non-trivial task. The mixer 10 is configured to multiply two input analog signals, the modulated and amplified excitation signal and the excitation signal. In some applications, this multiplication function is to be linear. To achieve a linear transfer function, the mixer 10 uses 10-12 bit linear multiplier. Such a mixer is difficult to build and is expensive.

Figure 8:
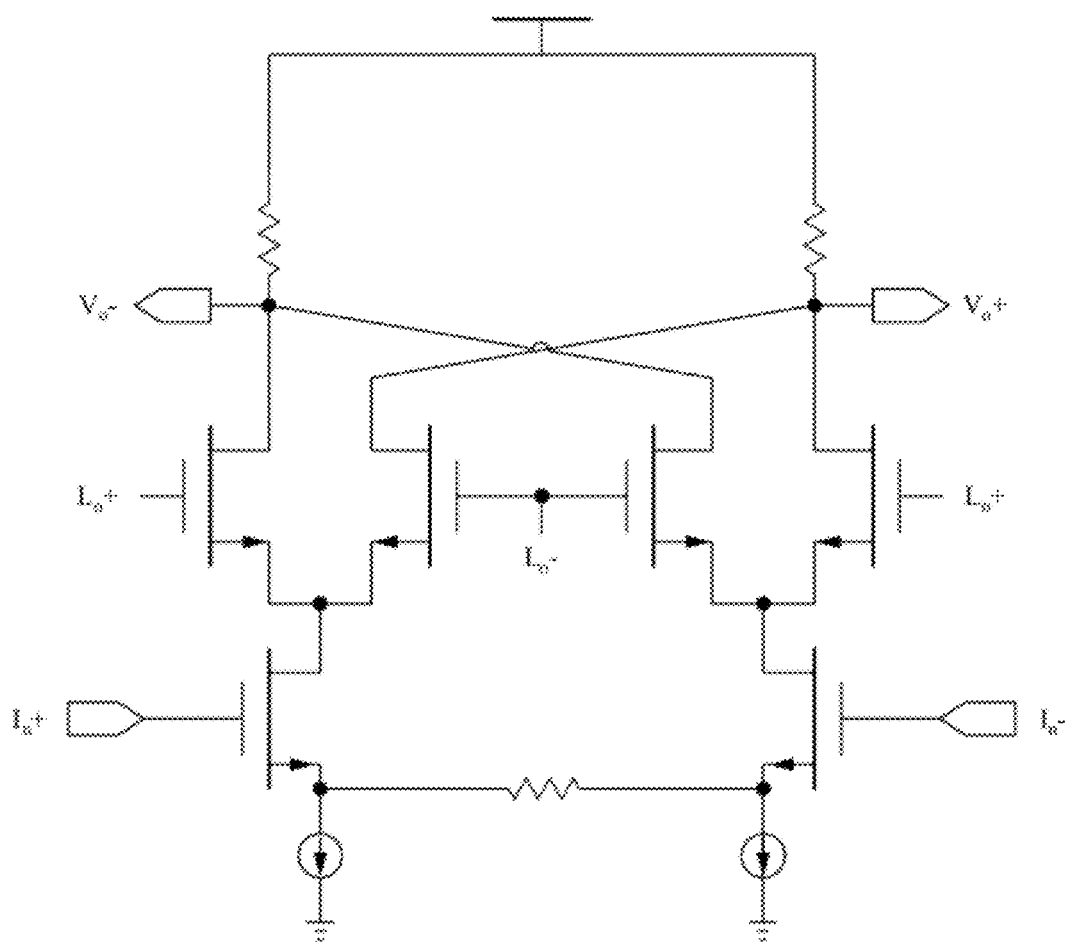
FIG. 8 illustrates a schematic circuit diagram of an exemplary mixing circuit according to an embodiment.

FIG. 8 illustrates a schematic circuit diagram of an exemplary mixing circuit according to an embodiment. The mixing circuit includes two input ports, an In port and an LO port. The In port receives the modulated signal output from the amplifier 9 (FIG. 6). The LO port receives the original excitation signal sin(ωt). Plus and minus ports represent a differential signal, as is well known in the art. The In port can be made linear, but the LO port is simply a switch that provides a square wave response. This provides limited rejection of undesired signals at the harmonics of the desired frequency. For example, 3rd harmonic of a square wave is only 8 dB below the fundamental; therefore, interference at 3*f would only see 8 dB attenuation.

In an alternative configuration, the function of the mixer and the integrator are combined and simplified so as to reduce the complexity associated with performing linear multiplication. Using a simplified description, a mixer can include an operational amplifier and a resistor pair including a variable resistor, where an output voltage of the mixer is a function of the input voltage multiplied by the ratio of the two resistors. An integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Notice is taken of the quantity 1/R in the aforementioned relationship between the input voltage and the output voltage of the integrator. Since a multiplying function is needed to mix the modulated excitation signal and the excitation signal, such as the function performed by the mixer 10 in FIG. 6, if the quantity 1/R can be appropriately modulated, the resistive element can be used to perform the multiplying function. A programmable resistive element can be used to perform this function. Instead of discrete mixing and integrator circuits, the two functions are combined as a single integrated circuit that includes a single operational-amplifier, a capacitor, and a programmable resistive element.

Figure 9:
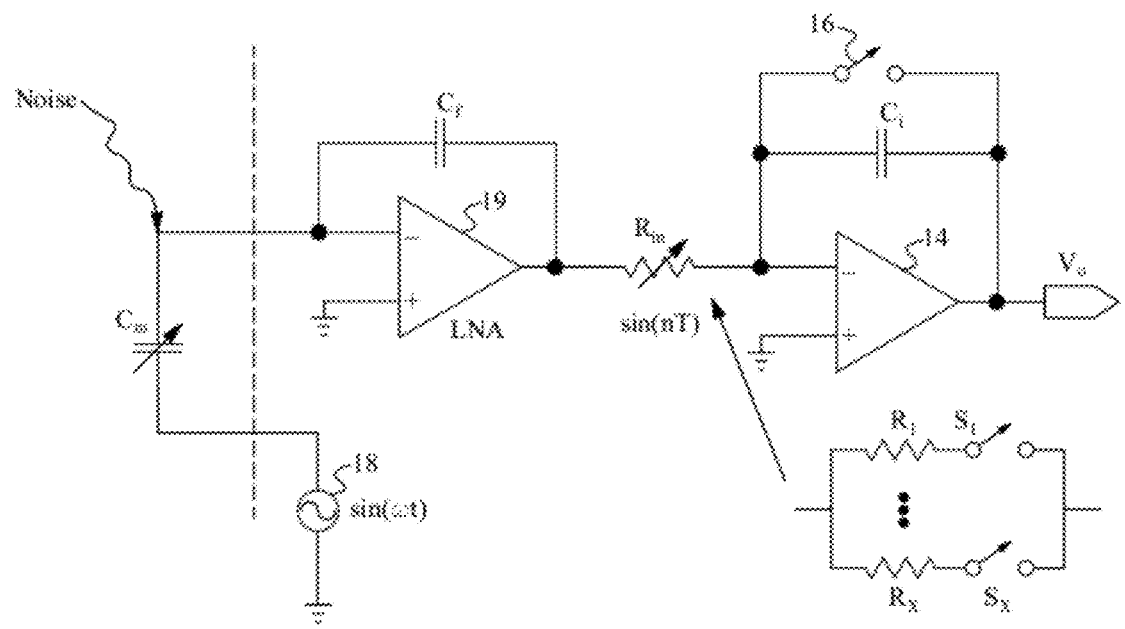
FIG. 9 illustrates a simplified schematic block diagram of an analog front end circuit using coherent detection according to a second embodiment.

FIG. 9 illustrates a simplified schematic block diagram of an analog front end circuit using coherent detection according to a second embodiment. A programmable resistive element Rin, an amplifier 14, and an integrating feedback capacitor Ci form an integrated circuit having the combined functionality of a mixer and an integrator. The programmable resistive element is represented in FIG. 9 as Rin with an arrow. In some embodiments, the programmable resistive element Rin is implemented as a digital array of resistors, shown in the expanded area in FIG. 9 as an array of resistors R1-Rx. Each resistor R1-Rx in the array is coupled to a corresponding on-off switch S1-Sx. One or more of the resistors R1-Rx in the array can be turned on such that the overall conductance of the programmable resistive element Rin imitates a desired waveform, such as a sine wave. In this manner, an appropriate combination of resistors in the array of resistors R1-Rx can be turned on to represent the multiplication of the modulated excitation signal and the excitation signal, thereby performing the multiplication function previously performed by the mixer 10 in FIG. 6.

The switches S1-Sx are controlled by a digitized waveform, such as a digitized sine wave. The conductance G(t) of the programmable resistive element Rin is equal to 1/R(t), which is proportional to the sine wave, where R(t) is the overall resistance of all turned on resistors in the array of resistors R1-Rx. The signal to be digitized is a correlation signal, which is correlated to the excitation signal generated by the signal generator 18. In an exemplary application, the sine wave $\sin(\omega t)$ is digitized. The resulting digital word is used to control the digital switches S1-Sx. This results in a conductance of the programmable resistor Rin that has the characteristic of a sine wave, represented as a digitized sine wave $\sin(nT)$, shown in FIG. 7, where "nT" indicates the sine wave is quantized, both in value and in time. The digitized sine wave $\sin(nT)$ is a summation of the piece-wise components of the programmable resistor array over the integration time period T. The time period T is a multiple of the period 1/f. The digitized sine wave $\sin(nT)$ can be stored in memory and subsequently retrieved for application to the digital switches S1-Sx.

The modulated excitation signal input to the programmable resistive element Rin is also shaped like a sine wave, and as such the result at the output of the programmable resistive element Rin is a multiplied value, which is then integrated according to the operational amplifier 14 and the integrating feedback capacitor Ci. The voltage Vout output from the integration is provided as input to an ADC (not shown) and subsequently processed. The ADC samples the voltage Vout every period of time, for example every 10 microseconds. After the voltage Vout is sampled, the integrating feedback capacitor Ci is discharged by closing the switch 16. After discharge, the switch 16 is opened for the next cycle defined by the integrating time period T.

The analog front end circuits of FIGS. 6 and 9 utilize coherent detection within a capacitance measurement application. In an exemplary application, the analog front end circuit uses coherent detection to measure capacitance of a touch screen display. The analog front end circuit provides excellent noise and interference immunity, and also provides a higher signal to noise ratio.

The analog front end circuit of FIG. 9 combines the functionality of a conventional mixer and integrator by using a programmable resistive element. This combined circuitry performs the multiplication function using a digitized waveform instead of an analog waveform. The digitized waveform is much easier to generate than the analog waveform. Additionally, the combined functionality is performed using a single operational amplifier, as opposed to using a discrete mixer having a first operational amplifier and a discrete integrator having a second operational amplifier.

The analog front end circuits of FIGS. 6 and 9 provide a continuous time signal path, there is no discrete sampling function performed where sampling is performed and then the charge across the capacitor is discharged. The signal continuously flows through the mixer and the integrator of FIG. 6, or through the programmable resistive element and the integrating capacitor of FIG. 9, and because of this there is no aliasing due to time instant sampling. Anti-aliasing is done within the correlator. There is no need for a separate anti-aliasing filter.

The analog front end circuit of FIG. 9 has good linearity because the resistors in the programmable resistive element Rin and the integrating feedback capacitor Ci are very linear.

Figure 4:
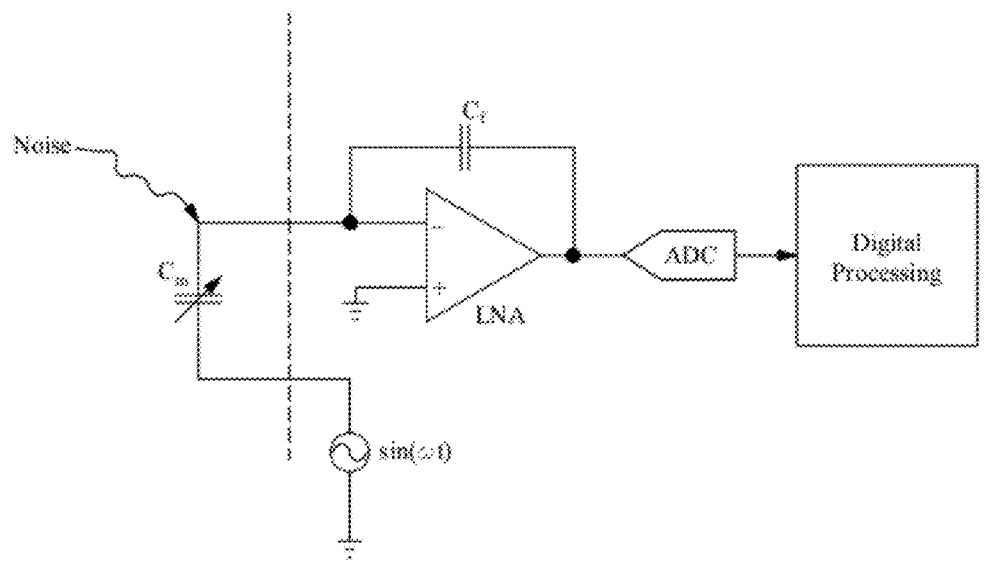
FIG. 4 illustrates a simplified schematic block diagram of a conventional analog front end circuit using digital filtering.
Figure 5:
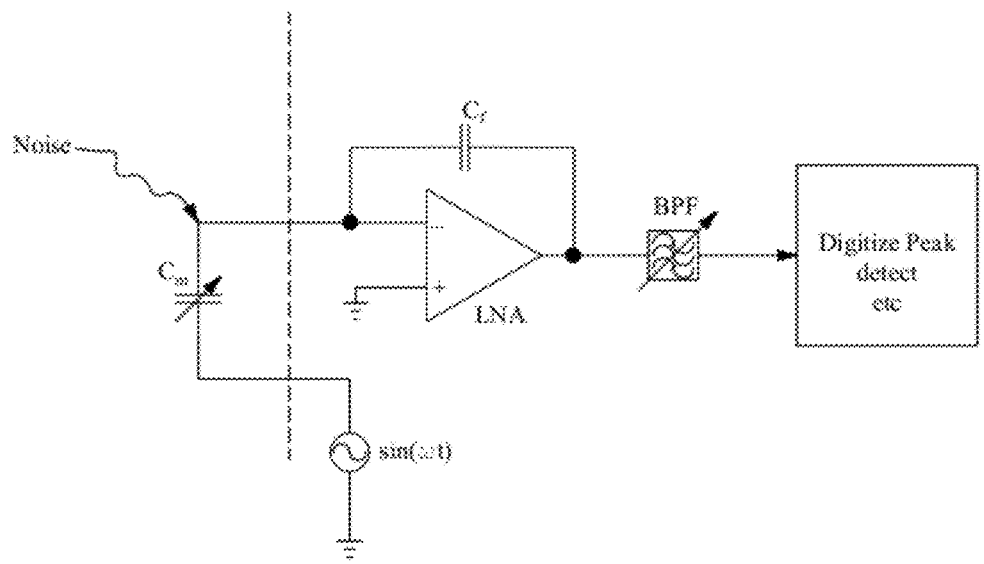
FIG. 5 illustrates a simplified schematic block diagram of another conventional analog front end circuit.

The analog front end circuits of FIGS. 6 and 9 use less power than the conventional analog front end circuits, such as the analog front end circuits of FIGS. 4 and 5. An ADC coupled to the analog front end circuits of FIGS. 6 and 9 does not require as much power as an ADC, such as the ADC used in FIG. 4, that is sampling an active analog signal. The ADC coupled to the analog front end circuits of FIGS. 6 and 9 can be slower and less precise. Also, performing the multiplication function using the programmable resistive element, as in FIG. 9, uses less power and has a smaller area than using a discrete mixing circuit, as in FIG. 6.

The analog front end circuits are described above as being applied to a touch screen application. Alternative applications are also contemplated.

Figure 10:
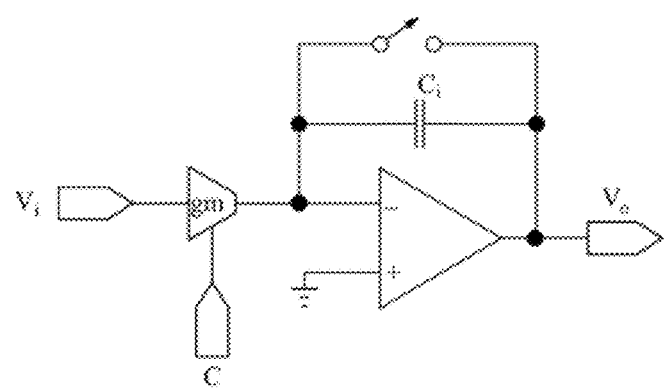
FIG. 10 illustrates a schematic diagram of an integrated mixing and integrating circuit including a transconductor as the time-varying impedance element according to an embodiment.

The integrated mixer and integrator is shown in FIG. 9 as including a programmable resistor array coupled to an amplifier and feedback capacitor. This concept can be generalized to use a time-varying impedance element that changes in response to an input control. The time-varying impedance element is coupled to the amplifier and feedback capacitor. FIG. 10 illustrates a schematic diagram of an integrated mixing and integrating circuit including a transconductor as the time-varying impedance element according to an embodiment. The transconductor has a programmable transconductance gm that is controlled using digital or analog control C. The transconductance gm can be changed over time to achieve a multiplication operation.

Figure 11:
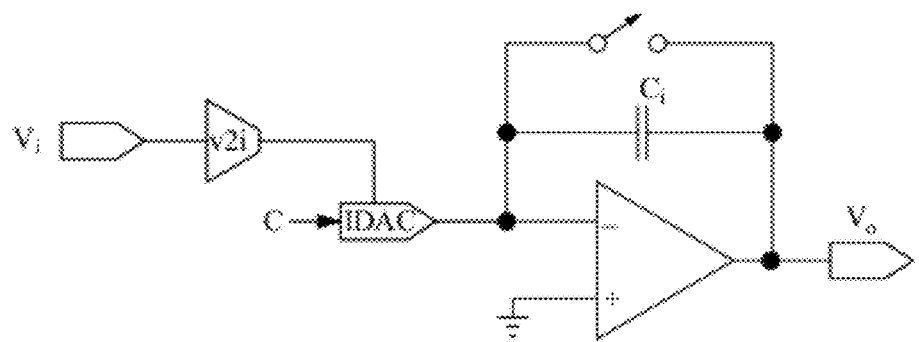
FIG. 11 illustrates a schematic diagram of an integrated mixing and integrating circuit including a current digital to analog converter (IDAC) as the time-varying impedance element according to an embodiment.

FIG. 11 illustrates a schematic diagram of an integrated mixing and integrating circuit including a voltage to current converter v2i and a current digital to analog converter (IDAC) as the time-varying impedance element according to an embodiment. The voltage to current converter v2i converts an input voltage to a corresponding current, which is supplied to the IDAC. The IDAC has a programmable gain that is controlled using digital or analog control C. The effective impedance can be changed over time to achieve a multiplication operation.

Figure 12:
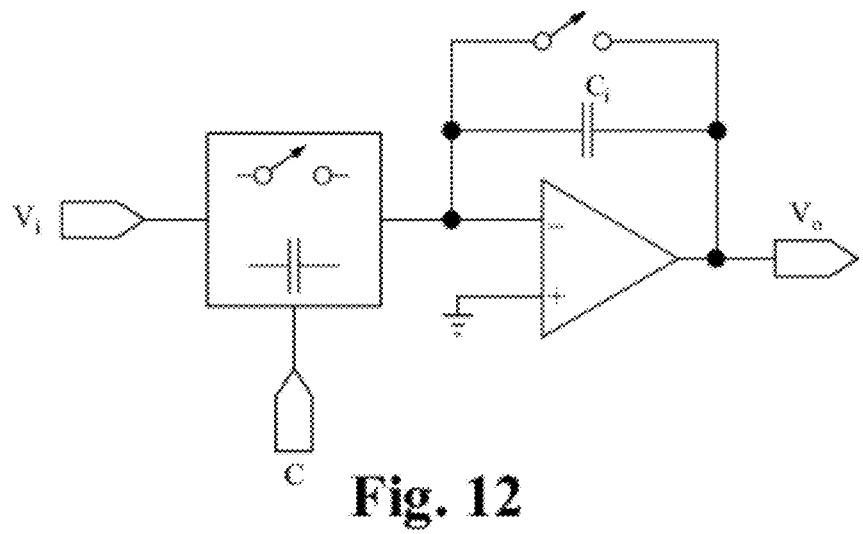
FIG. 12 illustrates a schematic diagram of an integrated mixing and integrating circuit including a programmable capacitive element as the time-varying impedance element according to an embodiment.

FIG. 12 illustrates a schematic diagram of an integrated mixing and integrating circuit including a programmable capacitive element as the time-varying impedance element according to an embodiment. The programmable capacitive element functions similarly as the programmable resistive element of FIG. 9 except for the use of capacitors instead of resistors. The capacitors in the programmable capacitive element are turned on or off to achieve a desired time-varying gain, which functions as the multiplication operation in the integrated mixing and integration circuit.

The integrated mixing and integrating circuits shown in FIGS. 9-12 can be used in applications alternative to touch screens including, but not limited to, radio frequency and thermal applications.

The programmable resistive element Rin, the switch 16, the amplifier 14, and the integrating feedback capacitor Ci in FIG. 9 are collectively referred to as a correlator. The integrating feedback capacitor Ci is a fixed capacitor. The programmable resistive element Rin is time-varying and represented as R(t). The relationship of the output voltage Vout to the input voltage Vin is:

$$Vout = \frac{1}{C}\int_0^T \frac{Vin(t)}{R(t)} dt \quad (3)$$

where C represents the capacitance of the integrating feedback capacitor Ci. Equation (3) can be rewritten as:

$$Vout = \frac{1}{C}\int_0^T G(t)Vin(t) dt \quad (4)$$

where G(t) is the conductance of the programmable resistive element, G(t)=1/R(t).

Figure 13:
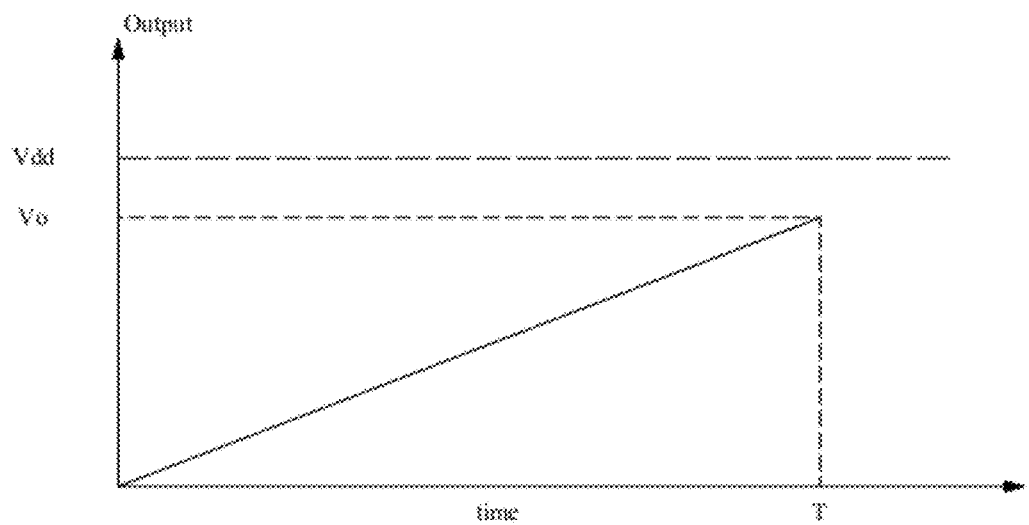
FIG. 13 illustrates an output voltage Vout versus time curve for the correlator of FIG. 9, under the simplified conditions where the resistance R(t) and the input voltage V(t) are constant.

FIG. 13 illustrates an output voltage Vout versus time curve for the correlator of FIG. 9, under the simplified conditions where the resistance R(t) and the input voltage V(t) are constant. The result is a linear function due to integration of a constant value in equation (4). As the positive input of the amplifier 14 (FIG. 9) is referenced to ground, the output voltage Vout is reset to 0V when the integrating feedback capacitor Ci is discharged, which corresponds to a new integration period starting at t=0. The longer the time period, the greater the output voltage Vout. In implementation, the output voltage Vout is limited to the system supply voltage Vdd supplied to the amplifier 14. As such, once the output voltage Vout reaches the supply voltage Vdd, the output voltage Vout no longer increases with time, but instead remains constant at the supply voltage level. The ramification is that if the application requires a larger time period t than the time for the output voltage to reach the supply voltage Vdd, the correlator of FIG. 9 is ineffective for the given value of the integrating feedback capacitor Ci. However, the slope of the output voltage Vout versus time curve is inversely related to the capacitance Ci. If the capacitance Ci is increased, then the slope of the curve is reduced, which means it takes a longer period of time for the output voltage to reach the supply voltage limit. Therefore, implementation of a larger capacitor enables the implementation of a longer time period for integration. However, a larger capacitor has a greater physical area. A larger capacitor also results in reduced sensitivity, since over the same integrating time period, a larger capacitor results in a lower integrated output voltage level than a smaller capacitor. In general, depending on the application and the corresponding integrating time period, the size of the integrating feedback capacitor Ci is optimized to result in the largest possible output voltage Vout. If the integration time period is shorter, then the size of the capacitor is smaller. If the integration time period is longer, then the size of the capacitor is larger. Having a fixed capacitance does not provide flexibility for varying applications.

In an exemplary touch screen display application, the frequency response is relatively slow, for example hundreds of kHz, and therefore the integration time period is relatively long and the RC product is relatively large. A large RC results in large physical area and uses a large amount of power to operate.

To address these limitations associated with a correlator having a fixed capacitance, the correlator of FIG. 9 can be adapted to include a charge adjustment circuit. The correlator and charge adjustment circuit are collectively referred to as a mixed signal correlator. As described above, the correlator of FIG. 9 has both mixing and integrating functionality. In some embodiments, the correlator is configured as a simple integrator. As a simple integrator, a fixed impedance element, such as a resistor, can be used instead of a time-varying impedance element, such as the programmable resistive element. Although a mixed signal correlator is subsequently described, it is understood that the concepts can be applied to an integrator.

Figure 14:
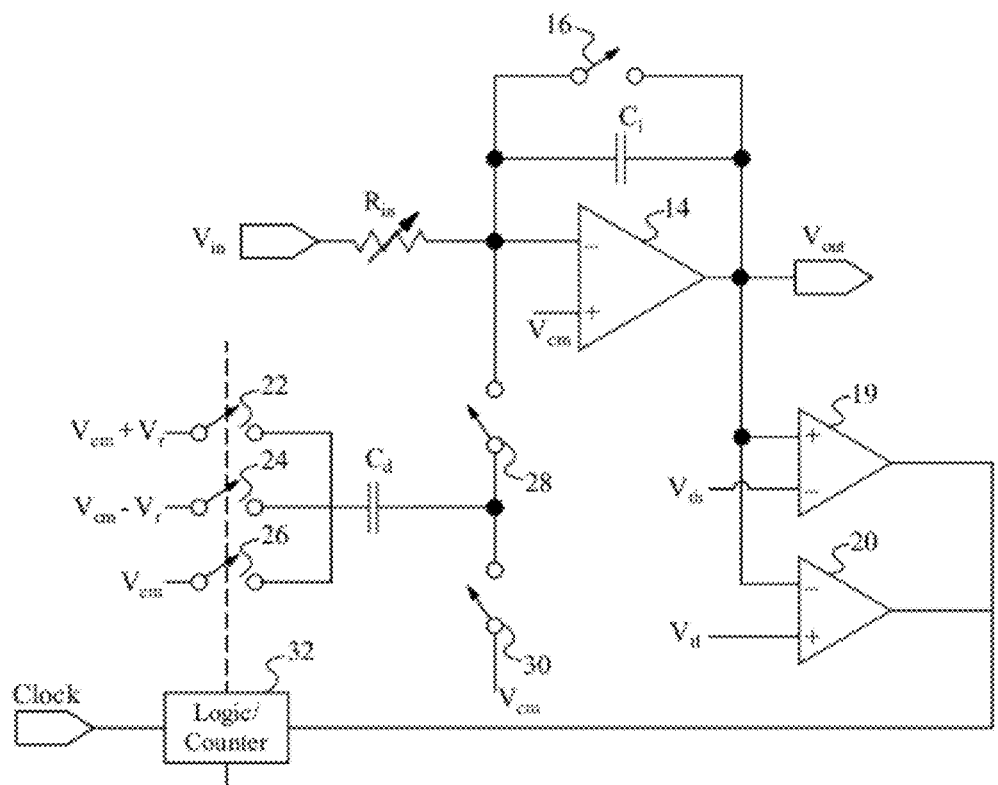
FIG. 14 illustrates a simplified schematic block diagram of a mixed signal correlator according to an embodiment.

FIG. 14 illustrates a simplified schematic block diagram of a mixed signal correlator according to an embodiment. The mixed signal correlator includes the correlator of FIG. 9, including the amplifier 14, the integrating feedback capacitor Ci, and the programmable resistive element Rin. The positive input of the amplifier 14 in FIG. 14 is coupled to a known voltage Vcm, such as one-half the supply voltage Vdd. The mixed signal correlator also includes two comparators 19 and 20, switches 22, 24, 26, 28, and 30, a charge dump capacitor Cd, and a logic/counter 32.

Figure 15:
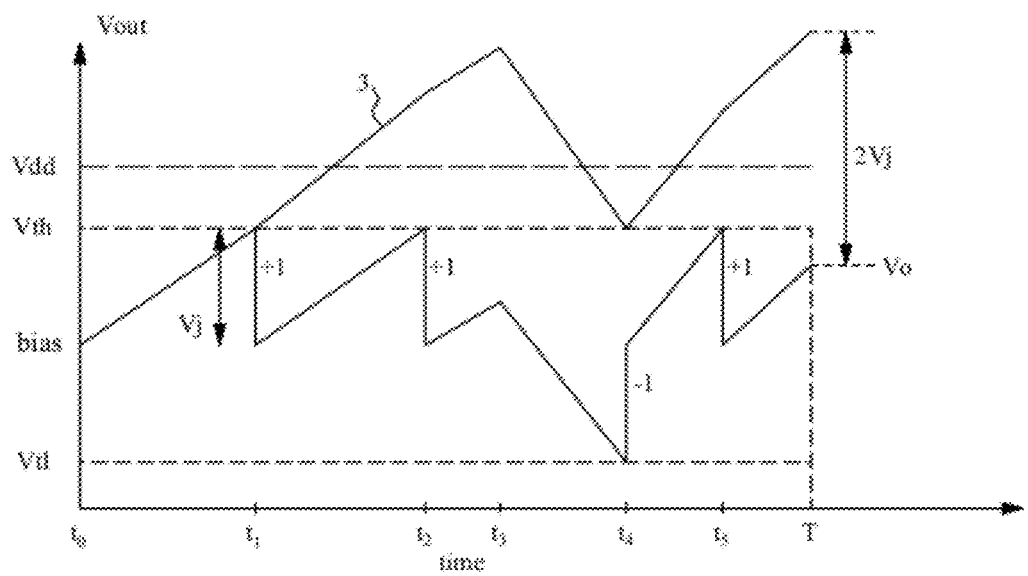
FIG. 15 illustrates an exemplary timing diagram corresponding to operation of the mixed signal correlator of FIG. 14.

FIG. 15 illustrates an exemplary timing diagram corresponding to operation of the mixed signal correlator of FIG. 14. The timing diagram shows the output voltage Vout versus time. The switches 22-30 are all shown to be open in FIG. 14, this is merely for illustration. During the course of operating the mixed signal correlator, various combinations of the switches are turned on an off, as will be described in connection with the timing diagram below.

After each integration period, the switch 16 is closed and the integrating feedback capacitor Ci is discharged. The switch 16 is then opened for the duration of the next integration period.

The timing diagram shows an integration period starting point at t=0. The output voltage Vout at the start of an integration period is equal to voltage Vcm supplied at the positive terminal of the amplifier 14, which in this case is one-half the supply voltage Vdd. The comparator 19 compares the instantaneous output voltage Vout to a threshold high voltage Vth, and the comparator 20 compares the instantaneous output voltage Vout to a threshold low voltage Vtl. As time increases from t=0, the output voltage Vout rises until it reaches the threshold high voltage level Vth at time t1. When the output voltage Vout equals or exceeds the threshold high voltage Vth, the comparator 19 signals the logic/counter 32 to perform a charge dump, or voltage adjustment, operation so that the output voltage Vout is reduced and remains within the supply voltage range. The threshold high voltage Vth is set to a value less than the supply voltage Vdd, and the threshold low voltage Vtl is set to a value greater than zero.

The logic/counter 32 controls the switches 22-30. While the output voltage Vout is within the threshold high and low voltage range, Vth and Vtl respectively, the switches 26 and 30 are closed and the switches 22, 24, and 28 are open so that the charge dump capacitor Cd is discharged. When the comparator 19 signals that the output voltage Vout equals or exceeds the threshold high voltage Vth, such as at time t1, the switches 30 and 26 are opened, the switch 24 stays open, then switches 22 and 28 are closed. The dump capacitor charges to reference voltage Vr and the charge Vr*Cd is dumped to the negative terminal of the operational amplifier 14, which causes a negative voltage adjustment −Vj in the output voltage Vout. The amount of voltage drop −Vj is determined according to the reference voltage Vr and the capacitances of the charge dump capacitor Cd and the integrating feedback capacitor Ci. Specifically, voltage drop −Vj=Vr(Cd/Ci). In the exemplary application shown in the timing diagram of FIG. 15, the voltage adjustment Vj is equal to one-half the difference between the threshold high voltage Vth and the threshold low voltage Vtl, thereby dropping the output voltage Vout to the midway point between the two threshold voltages. The timing diagram shows application of the voltage adjustments, such as at time t1, as an instantaneous response when reaching the threshold voltage. This is merely for illustrative purposes. In practice, there is a delay corresponding to charging the dump capacitor Cd.

After the output voltage adjustment at time t1, the switches 22 and 28 are opened, the switch 24 remains open, and the switches 26 and 30 are closed so that the charge dump capacitor Cd discharges. As time increases, t>t1, the output voltage Vout increases until it again reaches the threshold high voltage Vth at time t2 and the output voltage downward adjustment, −Vj, is again triggered and initiated.

The secondary curve 3 in the timing diagram reflects the output voltage Vout if the circuit were configured without the voltage adjustments, as in the correlator of FIG. 9, and the circuit were not limited by the supply voltage Vdd. In practice, the output voltage Vout would not be able to exceed the supply voltage Vdd.

After the second output voltage adjustment at time t2, the switches 22 and 28 are opened, the switch 24 remains open, and the switches 26 and 30 are closed so that the charge dump capacitor Cd discharges. As time increases, t>t2, the output voltage Vout increases. However, in this case the output voltage Vout eventually begins to decrease in value without reaching the triggering threshold high voltage Vth. The drop in output voltage Vout is due to a change in sign of the input voltage Vin, such as at time t3. As time increases, t>t3, the output voltage Vout continues to decrease until it reaches the threshold low voltage level Vtl at time t4. When the output voltage Vout equals or is less than the threshold low voltage Vtl, the comparator 20 signals the logic/counter 32 to perform a charge dump operation so that the output voltage Vout is increased and remains within the supply voltage range.

When the comparator 20 signals that the output voltage Vout equals or is less than the threshold low voltage Vtl, the switches 26 and 30 are opened, the switch 22 remains open, then the switches 24 and 30 are closed so as to appropriately charge the charge dump capacitor Cd. The dump capacitor charges to reference voltage −Vr and the charge −Vr*Cd is dumped to the negative terminal of the operational amplifier 14, which causes a positive voltage adjustment +Vj in the output voltage Vout. The amount of voltage gain +Vj is determined according to the reference voltage Vr and the capacitances of the charge dump capacitor Cd and the integrating feedback capacitor Ci. Specifically, voltage gain +Vj=Vr(Cd/Ci).

After the third output voltage adjustment at time t4, the switches 24 and 28 are opened, the switch 22 remains open, and the switches 26 and 30 are closed so that the charge dump capacitor Cd discharges. As time increases, t>t4, the output voltage Vout increases until it again reaches the threshold high voltage Vth at time t5 and the output voltage downward adjustment, −Vj, is again triggered and initiated.

After the fourth output voltage adjustment at time t5, the switches 22 and 28 are opened, the switch 24 remains open, and the switches 26 and 30 are closed so that the charge dump capacitor Cd discharges. As time increases, t>t5, the output voltage Vout increases until the end of the integration period at time T.

It is understood that the circuitry used to generate the output voltage adjustments +Vj and −Vj is but one example and that other circuit configurations can be used to achieve the same output voltage adjustments.

The logic/counter 32 maintains a running count Cn of the number of output voltage adjustments made during an integration period. In the case of a voltage adjustment drop, −Vj, when the output voltage Vout reaches the threshold high voltage Vth, the count increases by one, +1. In the case of a voltage adjustment gain, +Vj, when the output voltage Vout reaches the threshold low voltage Vtl, the count decreases by one, −1. As applied to the timing diagram of FIG. 15, the count at time T is equal to +2 due to three voltage drops, +3, and one voltage gain, −1.

To determine the actual integrated output voltage over the integration period T, the output voltage Vout at time T is added to the product of the current count Cn and the voltage adjustment Vj. As applied to the timing diagram of FIG. 15, the actual integrated output voltage equals the current output voltage Vout+2Vj, since the count Cn corresponding to the timing diagram of FIG. 15 is +2. The actual integrated output voltage over the integration period T is also referred to as the reconstructed output voltage.

Figure 16:
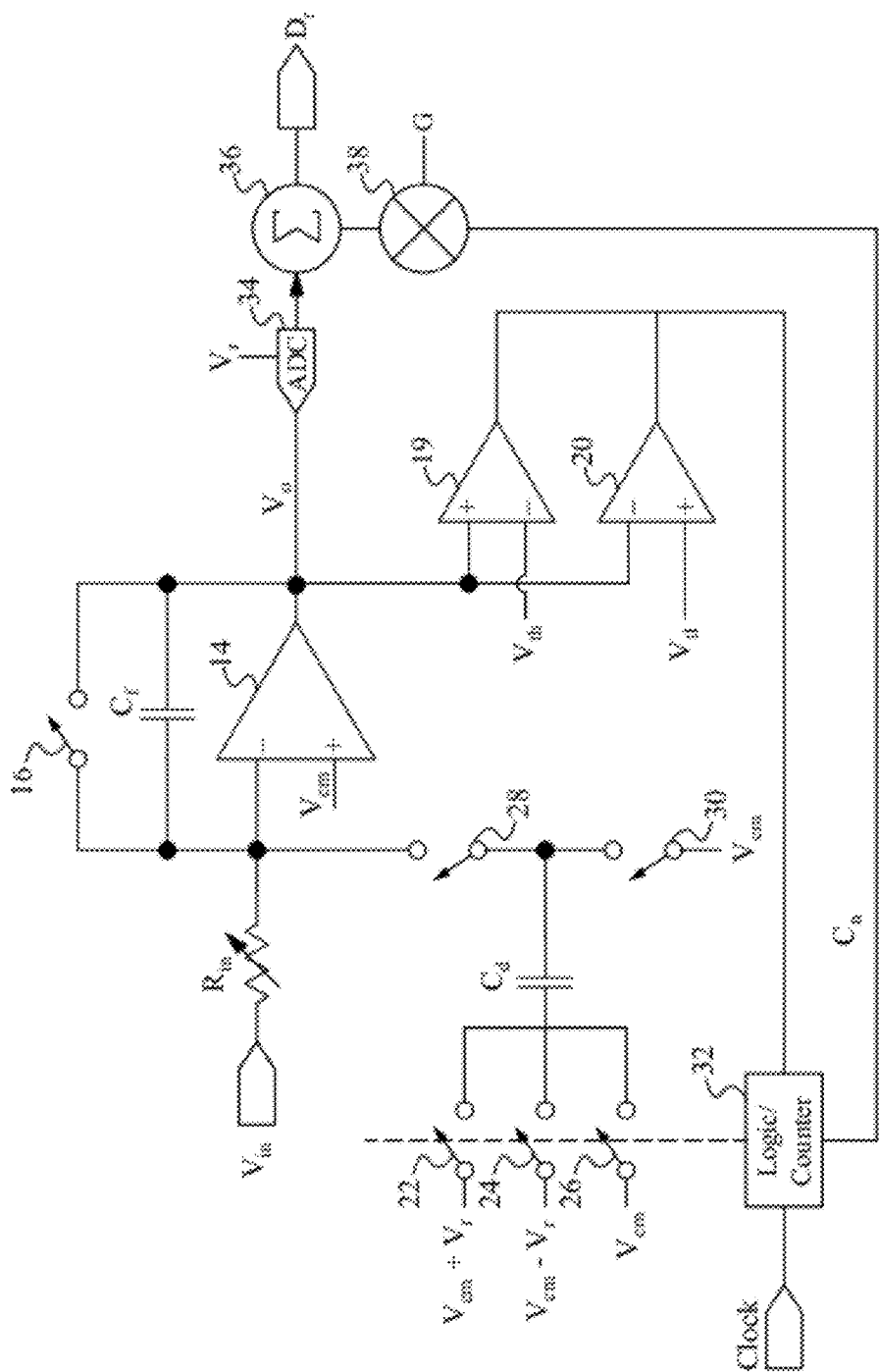
FIG. 16 illustrates a circuit for implementing the mixed signal correlator of FIG. 9 according to an embodiment.

FIG. 16 illustrates a circuit for implementing the mixed signal correlator of FIG. 9 according to an embodiment. An ADC 34 is coupled to receive the output voltage Vout. The ADC 34 also inputs a reference voltage Vr. A digital output of the ADC 34 is coupled to a summing circuit 36. A multiplier 38 is coupled to the logic/counter 32 to receive the count Cn, where the count Cn is the count at time T, the end of the integration period. The multiplier 38 also receives as input a constant G, where G is a digital representation of the voltage adjustment Vj. The multiplier 38 outputs the product Cn*G to the summing circuit 36, where the converted digital output voltage is added to the product Cn*G. The output Dr of the summing circuit 36 is the digital representation of the reconstructed output voltage. The output Dr is a weighted sum of an analog integrator output and a digital counter output.

Using the output voltage adjustment technique of the mixed signal correlator, the output voltage Vout is maintained within the range bounded by the threshold high voltage Vth and the threshold low voltage Vtl, and the actual integrated output voltage over the integration period can be reconstructed as if the limit of the supply voltage did not exist. Using the output voltage adjustment technique of the mixed signal correlator also enables the use of a smaller capacitor for capacitance measuring, which results in greater sensitivity. This technique is also independent of the integration period, the integration period can be set as long or as short as necessary. In this manner, the integration time is decoupled from the size of the capacitor. The maximum integration time can be increased by adding bits to the counter 32. Additional counter bits also increases the final resolution of the final output.

In an alternative embodiment, the comparator functions performed by the mixed signal correlator are performed in software. For example, the comparators 19 and 20 can be replaced by software, operating for example in the control/ logic block 32, where the software compares the instantaneous output voltage Vout to high and low threshold values stored in memory.

The mixed signal correlator described above includes a single counter for maintaining a running resulting count of both positive and negative voltage adjustments. Alternatively, separate counters can be used, a first counter to count the positive voltage adjustments and a second counter to count the negative voltage adjustments. The two counts can then be totaled, where the count for the first counter is considered positive and the count for the second counter is considered negative.

The present application has been described in terms of specific embodiments incorporating details to facilitate the understanding of the principles of construction and operation of the mixed signal correlator. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed:

1. An integration circuit comprising:
    a resistive element configured to receive an input voltage signal;
    an amplifier coupled to an output of the resistive element;
    an integrating feedback capacitor coupled to an input of the amplifier and to an output of the amplifier;
    a voltage adjustment circuit coupled to the input of the amplifier, wherein the voltage adjustment circuit is configured to adjust an output voltage at the output of the amplifier by a voltage adjustment if the output voltage reaches one or more defined limits;
    a logic circuit coupled to the voltage adjustment circuit, wherein the logic circuit is configured to control the voltage adjustment circuit and to count a number of times the voltage adjustment is performed by the voltage adjustment circuit during an integration time period, wherein each voltage adjustment of the output voltage comprises a fixed adjustment voltage Vj; and
    a multiplication circuit coupled to the logic circuit, wherein the multiplication circuit receives a first input comprising a count of the number of times the voltage adjustment is performed by the voltage adjustment circuit during the integration time period and a second input comprising a digital representation of the adjustment voltage Vj, and the multiplication circuit outputs a product of the first and second inputs.

2. The integration circuit of claim 1 wherein the one or more defined limits comprise a threshold high voltage Vth and a threshold low voltage Vtl.

3. The integration circuit of claim 2 wherein the adjustment voltage Vj is a positive value if the output voltage decreases to the threshold low voltage Vtl, and the adjustment voltage Vj is a negative value if the output voltage increases to the threshold high voltage Vth.

4. The integration circuit of claim 3 further comprising an analog-to-digital convertor coupled to the output of the amplifier to convert the output voltage to a digital value at each integration time period.

5. The integration circuit of claim 1 further comprising a summing circuit coupled to the analog-to-digital converter and to the multiplication circuit, wherein the summing circuit is configured to add the digital value output from the analog-to-digital converter and the product output from the multiplication circuit to generate a reconstructed voltage output for the integration time period.

6. The integration circuit of claim 1 wherein a size of the integrating feedback capacitor is independent of the integration time period such that the integration time period is decoupled from an RC time constant of the integration circuit.

7. The integration circuit of claim 1 further comprising a comparison circuit coupled to the integrating feedback capacitor, the amplifier, and the logic circuit, wherein the comparison circuit is configured to receive the output voltage, to compare the output voltage to the one or more defined limits, and to output a comparison result to the logic circuit.

8. The integration circuit of claim 1 wherein the logic circuit includes program instructions configured to perform the steps of comparing the output voltage to the one or more defined limits, and to control the voltage adjustment circuit according to a comparison result.

9. The integration circuit of claim 1 wherein the voltage adjustment circuit comprises a capacitor and a plurality of switches, wherein the capacitor is coupled to the integrating feedback capacitor via a first switch of the plurality of switches, and the plurality of switches are coupled to the logic circuit.

10. The integration circuit of claim 1 wherein the resistive element has a fixed impedance.

11. The integration circuit of claim 1 wherein the resistive element has a time-varying impedance.

12. A method of integrating an output voltage, the method comprising:
    integrating a charge on a capacitor included in an integrator and outputting an instantaneous integrated output voltage according to a current charge accumulated by the capacitor;
    comparing the instantaneous integrated output voltage to one or more threshold values to determine if the instantaneous integrated output voltage is within a voltage range;
    adjusting the charge on the capacitor if the instantaneous integrated output voltage is not within the voltage range, thereby maintaining the instantaneous integrated output voltage within a voltage range;
    accumulating voltage change corresponding to all increases and decreases in charge applied within an integrating period; and
    adding the accumulated voltage change to the instantaneous integrated output voltage at the end of the integrating period to obtain a total integration voltage over the integrating period.

13. The method of claim 12 wherein adjusting the charge comprises decreasing the charge on the capacitor if the instantaneous integrated output voltage is greater than or equal to a high threshold value, and increasing the charge on the capacitor if the instantaneous integrated output voltage is less than or equal to a low threshold voltage, wherein decreasing the charge on the capacitor decreases the instantaneous integrated output voltage and increasing the charge on the capacitor increases the instantaneous integrated output voltage.

14. The method of claim 12 wherein the charge is continuously integrated by the capacitor during the integrating period.

15. The method of claim 12 wherein the integrating period is decoupled from an RC time constant of the integrator.

16. The method of claim 12 wherein comparing the instantaneous integrated output voltage to one or more threshold values is performed in software.

17. The method of claim 12 wherein comparing the instantaneous integrated output voltage to one or more threshold values is performed using one or more comparators.

18. The method of claim 12 wherein adjusting the charge on the capacitor results in adjusting the instantaneous integrated output voltage.

19. The method of claim 18 wherein each adjustment of the instantaneous integrated output voltage comprises a fixed adjustment voltage Vj.

20. The method of claim 19 wherein the one or more threshold values comprise a threshold high voltage Vth and a threshold low voltage Vtl.

21. The method of claim 20 wherein the adjustment voltage Vj is a positive value if the output voltage decreases to the threshold low voltage Vtl, and the adjustment voltage Vj is a negative value if the output voltage increases to the threshold high voltage Vth.

22. The method of claim 21 wherein determining the total integration voltage comprises converting the instantaneous integrated output voltage to a digital value at each integration time period and adding the accumulated voltage change to the digital value.

* * * * *

UNITED STATES PATENT AND TRADEMARK OFFICE
CERTIFICATE OF CORRECTION

| | | |
|---|---|---|
| PATENT NO. | : 8,575,988 B2 | Page 1 of 6 |
| APPLICATION NO. | : 13/404722 | |
| DATED | : November 5, 2013 | |
| INVENTOR(S) | : Ozan E. Erdogan | |

Figure 1:
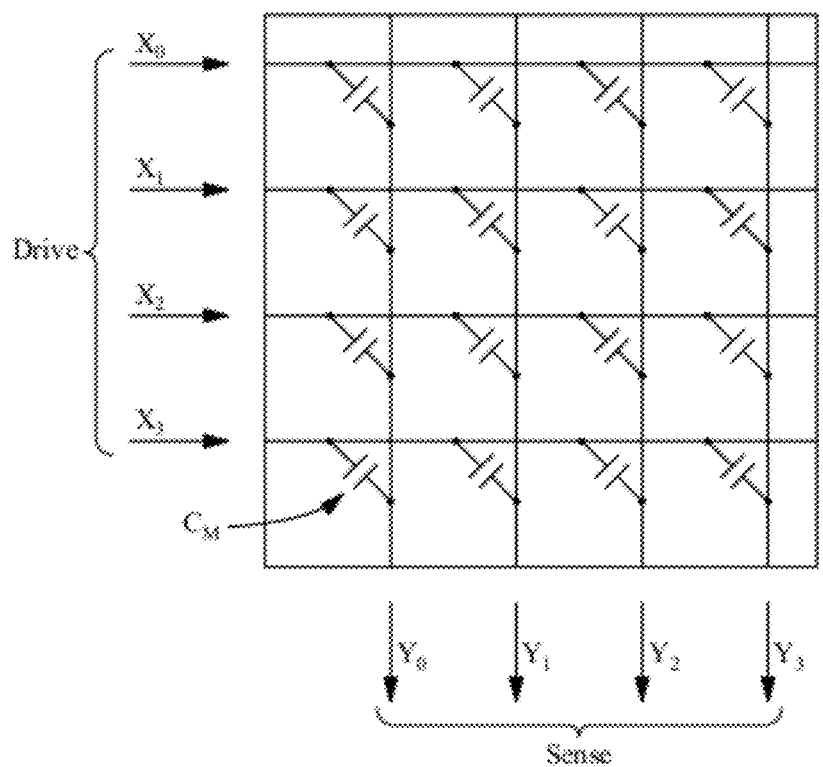
FIG. 1 illustrates an exemplary conventional capacitive touch sensor used in a capacitive touchscreen panel.
Figure 2A:
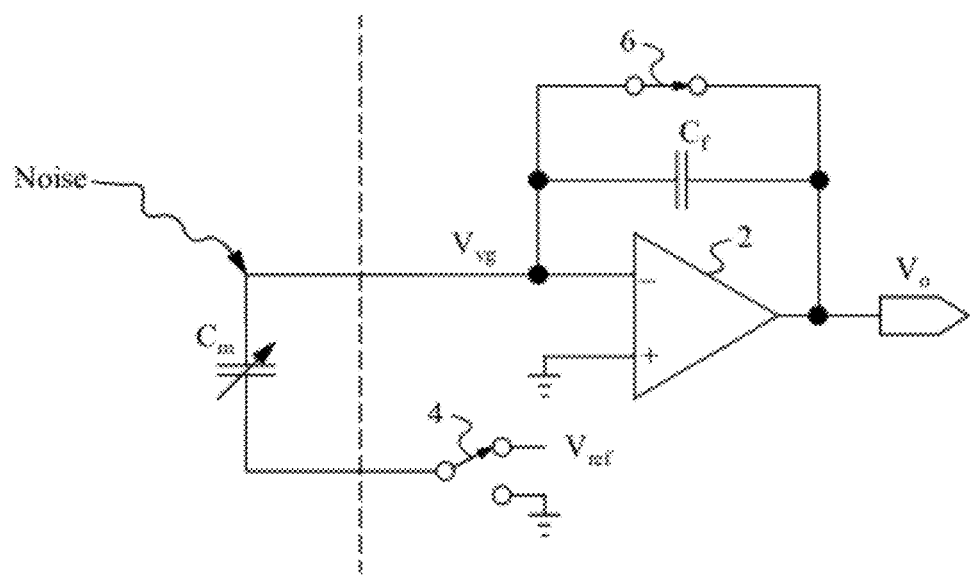
FIGS. 2A and 2B illustrate a simplified schematic block diagram of a conventional analog front end circuit used for measuring a capacitance of an external capacitor and converting the measured capacitance to a corresponding voltage.
Figure 2B:
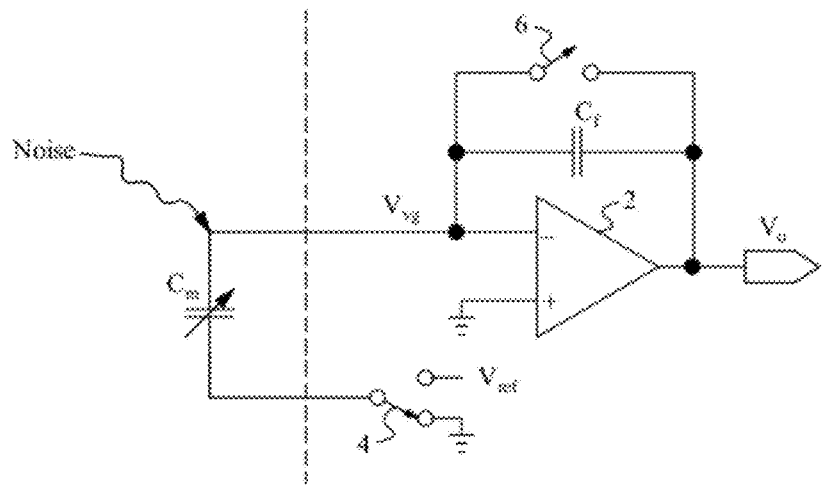
Figure 3:
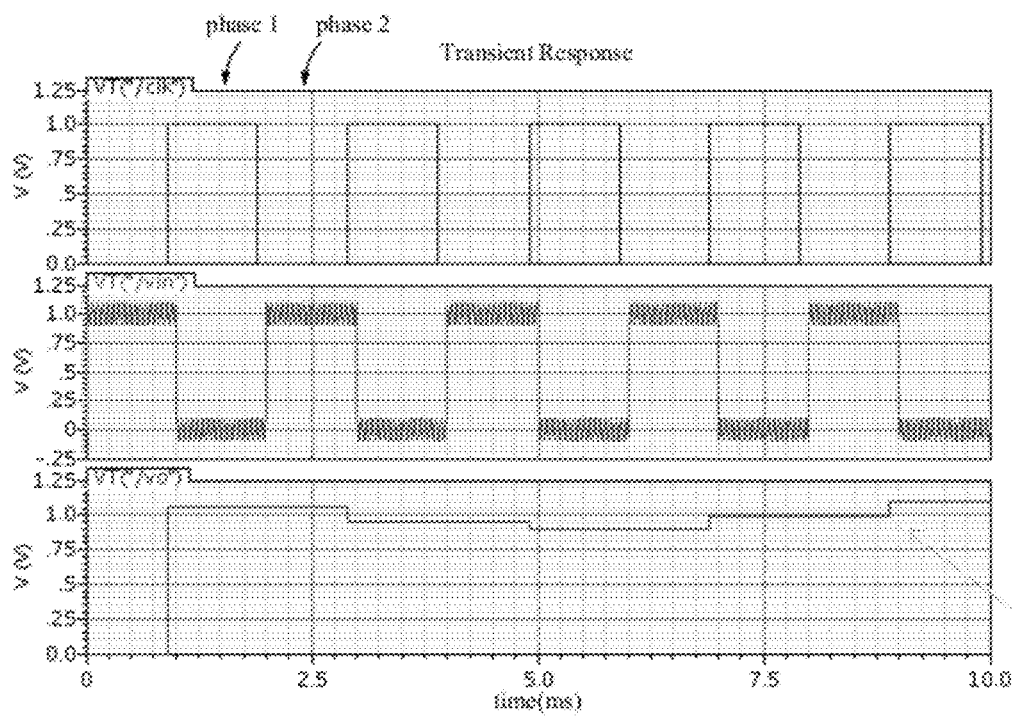
FIG. 3 illustrates exemplary response curves for the circuit of FIGS. 2A and 2B.

It is certified that error appears in the above-identified patent and that said Letters Patent is hereby corrected as shown below:

In the Drawings:
| | |
|---|---|
| Sheet 1 of 10, Fig. 1 | Delete "$C_M$" and insert --$C_m$-- |
| Sheet 9 of 10, Fig. 15 | Delete "Vout" and insert --$V_{out}$-- |
| Sheet 9 of 10, Fig. 15 | Delete "Vth" and insert --$V_{th}$-- |
| Sheet 9 of 10, Fig. 15 | Delete "Vtl" and insert --$V_{tl}$-- |

In the Specifications:
| | |
|---|---|
| Column 1, Lines 58-59 | Delete "conductive; therefore," and insert --conductive and therefore-- |
| Column 2, Line 13 | Delete "X0, X1, X2, X3," and insert --$X_0$, $X_1$, $X_2$, $X_3$,-- |
| Column 2, Lines 14-15 | Delete "Y0, Y1, Y2, Y3," and insert --$Y_0$, $Y_1$, $Y_2$, $Y_3$,-- |
| Column 2, Line 17 | Delete "Cm." and insert --$C_m$.-- |
| Column 2, Line 21 | Delete "Cm" and insert --$C_m$-- |
| Column 2, Line 22 | Delete "Cm" and insert --$C_m$-- |
| Column 2, Line 26 | Delete "Cm" and insert --$C_m$-- |
| Column 2, Line 38 | Delete "Cm" and insert --$C_m$-- |
| Column 2, Line 41 | Delete "Cm." and insert --$C_m$.-- |
| Column 2, Line 42 | Delete "Cm" and insert --$C_m$-- |
| Column 2, Line 42 | Delete "Cf" and insert --$C_f$-- |
| Column 2, Line 43 | Delete "Vout" and insert --$V_{out}$-- |
| Column 2, Line 44 | Delete "Cm," and insert --$C_m$,-- |
| Column 2, Line 46 | Delete "Cf," and insert --$C_f$,-- |
| Column 2, Line 48 | Delete "Cm," and insert --$C_m$,-- |
| Column 2, Line 48 | Delete "Vvg." and insert --$V_{vg}$.-- |
| Column 2, Line 49 | Delete "Vref," and insert --$V_{ref}$,-- |
| Column 2, Line 50 | Delete "Cf" and insert --$C_f$-- |
| Column 2, Line 52 | Delete "Cm" and insert --$C_m$-- |
| Column 2, Line 52 | Delete "Vvg-Vref" and insert --$V_{vg}$-$V_{ref}$-- |
| Column 2, Line 52 | Delete "Cm." and insert --$C_m$.-- |

Signed and Sealed this
Twenty-eighth Day of October, 2014

Michelle K. Lee
*Deputy Director of the United States Patent and Trademark Office*

CERTIFICATE OF CORRECTION (continued)
U.S. Pat. No. 8,575,988 B2

| | |
|---|---|
| Column 2, Line 55 | Delete "Cm" and insert --$C_m$-- |
| Column 2, Line 56 | Delete "Cm" and insert --$C_m$-- |
| Column 2, Line 57 | Delete "Cf." and insert --$C_f$.-- |
| Column 2, Line 57 | Delete "Vout" and insert --$V_{out}$-- |
| Column 2, Line 59 | Delete "Cm" and insert --$C_m$-- |
| Column 2, Line 59 | Delete "Cf." and insert --$C_f$.-- |
| Column 2, Line 60 | Delete "Vout" and insert --$V_{out}$-- |
| Column 2, Line 62 | Delete "Cf" and insert --$C_f$-- |
| Column 2, Line 63 | Delete "Cf" and insert --$C_f$-- |
| Column 2, Line 65 | Delete "Cm." and insert --$C_m$.-- |
| Column 2, Line 65 | Delete "Cf" and insert --$C_f$-- |
| Column 2, Line 66 | Delete "Cf" and insert --$C_f$-- |
| Column 3, Line 1 | Delete "Vout=Vref*Cm/Cf+vn," and insert --$V_{out}=V_{ref}*C_m/C_f+vn$,-- |
| Column 3, Line 1 | Delete "Vref" and insert --$V_{ref}$-- |
| Column 3, Line 3 | Delete "Cf" and insert --$C_f$-- |
| Column 3, Line 4 | Delete "Cm" and insert --$C_m$-- |
| Column 3, Line 5 | Delete "Vref" and insert --$V_{ref}$-- |
| Column 3, Line 5 | Delete "Cf" and insert --$C_f$-- |
| Column 3, Line 5 | Delete "Vout." and insert --$V_{out}$.-- |
| Column 3, Line 6 | Delete "Cm" and insert --$C_m$-- |
| Column 3, Line 15 | Delete "Cf." and insert --$C_f$.-- |
| Column 3, Line 16 | Delete "Vout." and insert --$V_{out}$.-- |
| Column 3, Line 17 | Delete "Vout" and insert --$V_{out}$-- |
| Column 3, Line 18 | Delete "Cm" and insert --$C_m$-- |
| Column 3, Line 21 | Delete "Vout" and insert --$V_{out}$-- |
| Column 3, Line 30 | Delete "Vout" and insert --$V_{out}$-- |
| Column 4, Line 47 | Delete "Vth" and insert --$V_{th}$-- |
| Column 4, Line 47 | Delete "Vtl." and insert --$V_{tl}$.-- |
| Column 4, Line 49 | Delete "Vtl," and insert --$V_{tl}$,-- |
| Column 4, Line 51 | Delete "Vth." and insert --$V_{th}$.-- |
| Column 5, Line 59 | Delete "Vth" and insert --$V_{th}$-- |
| Column 5, Line 59 | Delete "Vtl." and insert --$V_{tl}$.-- |
| Column 5, Line 61 | Delete "Vtl," and insert --$V_{tl}$,-- |
| Column 5, Line 63 | Delete "Vth." and insert --$V_{th}$.-- |
| Column 7, Line 42 | Delete "Vref." and insert --$V_{ref}$.-- |
| Column 7, Line 42 | Delete "Vref*sin(ωt)" and insert --$V_{ref}*sin(\omega t)$-- |
| Column 7, Line 44 | Delete "Cm." and insert --$C_m$.-- |
| Column 7, Lines 51-52 | Delete "Cm/2Cf)Vref" and insert --$C_m/2C_f)V_{ref}$-- |
| Column 7, Line 67 | Delete "Vout" and insert --$V_{out}$-- |
| Column 9, Line 14 | Delete "Rin," and insert --$R_{in}$,-- |
| Column 9, Line 14 | Delete "Ci" and insert --$C_i$-- |
| Column 9, Line 17 | Delete "Rin" and insert --$R_{in}$-- |
| Column 9, Line 18 | Delete "Rin" and insert --$R_{in}$-- |
| Column 9, Line 20 | Delete "R1-Rx." and insert --$R_1-R_x$.-- |
| Column 9, Line 21 | Delete "R1-Rx" and insert --$R_1-R_x$-- |

CERTIFICATE OF CORRECTION (continued)
U.S. Pat. No. 8,575,988 B2

| | |
|---|---|
| Column 9, Line 22 | Delete "S1-Sx." and insert --$S_1$-$S_x$.-- |
| Column 9, Line 22 | Delete "R1-Rx" and insert --$R_1$-$R_x$-- |
| Column 9, Line 24 | Delete "Rin" and insert --$R_{in}$-- |
| Column 9, Line 26 | Delete "R1-Rx" and insert --$R_1$-$R_x$-- |
| Column 9, Line 31 | Delete "S1-Sx" and insert --$S_1$-$S_x$-- |
| Column 9, Line 33 | Delete "Rin" and insert --$R_{in}$-- |
| Column 9, Line 36 | Delete "R1-Rx." and insert --$R_1$-$R_x$.-- |
| Column 9, Line 40 | Delete "S1-Sx." and insert --$S_1$-$S_x$.-- |
| Column 9, Line 50 | Delete "S1-Sx." and insert --$S_1$-$S_x$.-- |
| Column 9, Line 52 | Delete "Rin" and insert --$R_{in}$-- |
| Column 9, Line 54 | Delete "Rin" and insert --$R_{in}$-- |
| Column 9, Line 56 | Delete "Ci." and insert --$C_i$.-- |
| Column 9, Line 56 | Delete "Vout" and insert --$V_{out}$-- |
| Column 9, Line 59 | Delete "Vout" and insert --$V_{out}$-- |
| Column 9, Line 60 | Delete "Vout" and insert --$V_{out}$-- |
| Column 9, Line 61 | Delete "Ci" and insert --$C_i$-- |
| Column 10, Line 26 | Delete "Rin" and insert --$R_{in}$-- |
| Column 10, Line 26 | Delete "Ci" and insert --$C_i$-- |
| Column 11, Line 11 | Delete "Rin," and insert --$R_{in}$,-- |
| Column 11, Line 12 | Delete "Ci" and insert --$C_i$-- |
| Column 11, Line 14 | Delete "Ci" and insert --$C_i$-- |
| Column 11, Line 15 | Delete "Rin" and insert --$R_{in}$-- |
| Column 11, Line 16 | Delete "Vout" and insert --$V_{out}$-- |
| Column 11, Line 17 | Delete "Vin" and insert --$V_{in}$-- |
| Column 11, Line 20 | Delete "Vin" and insert --$V_{in}$-- |
| Column 11, Line 21 | Delete "Vout" and insert --$V_{out}$-- |
| Column 11, Line 25 | Delete "Ci" and insert --$C_i$-- |
| Column 11, Line 29 | Delete "Vout" and insert --$V_{out}$-- |
| Column 11, Line 29 | Delete "Vin" and insert --$V_{in}$-- |
| Column 11, Line 34 | Delete "Vout" and insert --$V_{out}$-- |
| Column 11, Line 40 | Delete "Vout" and insert --$V_{out}$-- |
| Column 11, Line 41 | Delete "Ci" and insert --$C_i$-- |
| Column 11, Line 43 | Delete "Vout." and insert --$V_{out}$.-- |
| Column 11, Line 44 | Delete "Vout" and insert --$V_{out}$-- |
| Column 11, Line 46 | Delete "Vout" and insert --$V_{out}$-- |
| Column 11, Line 46 | Delete "Vout" and insert --$V_{out}$-- |
| Column 11, Line 52 | Delete "Ci." and insert --$C_i$.-- |
| Column 11, Line 53 | Delete "Vout" and insert --$V_{out}$-- |
| Column 11, Line 54 | Delete "Ci." and insert --$C_i$.-- |
| Column 11, Line 54 | Delete "Ci" and insert --$C_i$-- |
| Column 11, Line 65 | Delete "Ci" and insert --$C_i$-- |
| Column 11, Line 66 | Delete "Vout." and insert --$V_{out}$.-- |
| Column 12, Line 27 | Delete "Ci," and insert --$C_i$,-- |
| Column 12, Line 27 | Delete "Rin." and insert --$R_{in}$.-- |
| Column 12, Line 29 | Delete "Vcm," and insert --$V_{cm}$,-- |

CERTIFICATE OF CORRECTION (continued)
U.S. Pat. No. 8,575,988 B2

| Column 12, Line 32 | Delete "Cd," and insert --$C_d$,-- |
| Column 12, Line 35 | Delete "Vout" and insert --$V_{out}$-- |
| Column 12, Line 39 | Delete "an" and insert --and-- |
| Column 12, Line 42 | Delete "Ci" and insert --$C_i$-- |
| Column 12, Line 46 | Delete "Vout" and insert --$V_{out}$-- |
| Column 12, Line 47 | Delete "Vcm" and insert --$V_{cm}$-- |
| Column 12, Line 50 | Delete "Vout" and insert --$V_{out}$-- |
| Column 12, Line 50 | Delete "Vth," and insert --$V_{th}$,-- |
| Column 12, Line 52 | Delete "Vout" and insert --$V_{out}$-- |
| Column 12, Line 52 | Delete "Vtl." and insert --$V_{tl}$.-- |
| Column 12, Line 53 | Delete "Vout" and insert --$V_{out}$-- |
| Column 12, Line 54 | Delete "Vth" and insert --$V_{th}$-- |
| Column 12, Line 54 | Delete "t1." and insert --$t_1$.-- |
| Column 12, Line 55 | Delete "Vout" and insert --$V_{out}$-- |
| Column 12, Line 55 | Delete "Vth," and insert --$V_{th}$,-- |
| Column 12, Line 58 | Delete "Vout" and insert --$V_{out}$-- |
| Column 12, Line 59 | Delete "Vth" and insert --$V_{th}$-- |
| Column 12, Line 61 | Delete "Vtl" and insert --$V_{tl}$-- |
| Column 12, Line 63 | Delete "Vout" and insert --$V_{out}$-- |
| Column 12, Line 64 | Delete "Vth and Vtl" and insert --$V_{th}$ and $V_{tl}$-- |
| Column 12, Line 66 | Delete "Cd" and insert --$C_d$-- |
| Column 12, Line 67 | Delete "Vout" and insert --$V_{out}$-- |
| Column 13, Line 1 | Delete "Vth," and insert --$V_{th}$,-- |
| Column 13, Line 1 | Delete "t1," and insert --$t_1$,-- |
| Column 13, Line 4 | Delete "Vr" and insert --$V_r$-- |
| Column 13, Line 4 | Delete "Vr*Cd" and insert --$V_r * C_d$-- |
| Column 13, Line 7 | Delete "Vout." and insert --$V_{out}$.-- |
| Column 13, Line 8 | Delete "Vr" and insert --$V_r$-- |
| Column 13, Line 9 | Delete "Cd" and insert --$C_d$-- |
| Column 13, Line 10 | Delete "Ci." and insert --$C_i$.-- |
| Column 13, Line 10 | Delete "-Vj=Vr(Cd/Ci)." and insert -- -Vj=$V_r(C_d/C_i)$.-- |
| Column 13, Line 13 | Delete "Vth" and insert --$V_{th}$-- |
| Column 13, Line 14 | Delete "Vtl," and insert --$V_{tl}$,-- |
| Column 13, Line 15 | Delete "Vout" and insert --$V_{out}$-- |
| Column 13, Line 17 | Delete "t1," and insert --$t_1$,-- |
| Column 13, Line 20 | Delete "Cd." and insert --$C_d$.-- |
| Column 13, Line 21 | Delete "t1," and insert --$t_1$,-- |
| Column 13, Line 24 | Delete "Cd" and insert --$C_d$-- |
| Column 13, Line 24 | Delete "t>t1," and insert --$t > t_1$,-- |
| Column 13, Line 25 | Delete "Vout" and insert --$V_{out}$-- |
| Column 13, Line 26 | Delete "Vth" and insert --$V_{th}$-- |
| Column 13, Line 26 | Delete "t2" and insert --$t_2$-- |
| Column 13, Line 29 | Delete "Vout" and insert --$V_{out}$-- |
| Column 13, Line 32 | Delete "Vout" and insert --$V_{out}$-- |
| Column 13, Line 34 | Delete "t2," and insert --$t_2$,-- |

CERTIFICATE OF CORRECTION (continued)
U.S. Pat. No. 8,575,988 B2

| | |
|---|---|
| Column 13, Line 37 | Delete "Cd" and insert --$C_d$-- |
| Column 13, Line 37 | Delete "t>t2," and insert --$t>t_2$,-- |
| Column 13, Line 38 | Delete "Vout" and insert --$V_{out}$-- |
| Column 13, Line 39 | Delete "Vout" and insert --$V_{out}$-- |
| Column 13, Line 40 | Delete "Vth." and insert --$V_{th}$.-- |
| Column 13, Line 41 | Delete "Vout" and insert --$V_{out}$-- |
| Column 13, Line 42 | Delete "Vin," and insert --$V_{in}$,-- |
| Column 13, Line 42 | Delete "t3." and insert --$t_3$.-- |
| Column 13, Line 42 | Delete "t>t3," and insert --$t>t_3$,-- |
| Column 13, Line 43 | Delete "Vout" and insert --$V_{out}$-- |
| Column 13, Line 44 | Delete "Vtl" and insert --$V_{tl}$-- |
| Column 13, Line 44 | Delete "t4." and insert --$t_4$.-- |
| Column 13, Line 45 | Delete "Vout" and insert --$V_{out}$-- |
| Column 13, Line 46 | Delete "Vtl," and insert --$V_{tl}$,-- |
| Column 13, Line 47 | Delete "Vout" and insert --$V_{out}$-- |
| Column 13, Line 50 | Delete "Vout" and insert --$V_{out}$-- |
| Column 13, Line 50 | Delete "Vtl," and insert --$V_{tl}$,-- |
| Column 13, Line 53 | Delete "Cd." and insert --$C_d$.-- |
| Column 13, Line 54 | Delete "-Vr" and insert -- -$V_r$-- |
| Column 13, Line 54 | Delete "-Vr*Cd" and insert -- -$V_r$*$C_d$-- |
| Column 13, Line 57 | Delete "Vout." and insert --$V_{out}$.-- |
| Column 13, Line 58 | Delete "Vr" and insert --$V_r$-- |
| Column 13, Line 59 | Delete "Cd" and insert --$C_d$-- |
| Column 13, Line 60 | Delete "Ci." and insert --$C_i$.-- |
| Column 13, Lines 60-61 | Delete "+Vj=Vr(Cd/Ci)." and insert --+Vj=$V_r(C_d/C_i)$.-- |
| Column 13, Line 62 | Delete "t4," and insert --$t_4$,-- |
| Column 13, Line 65 | Delete "Cd" and insert --$C_d$-- |
| Column 13, Line 65 | Delete "t>t4," and insert --$t>t_4$,-- |
| Column 13, Line 66 | Delete "Vout" and insert --$V_{out}$-- |
| Column 14, Line 1 | Delete "Vth" and insert --$V_{th}$-- |
| Column 14, Line 1 | Delete "t5" and insert --$t_5$-- |
| Column 14, Line 3 | Delete "t5," and insert --$t_5$,-- |
| Column 14, Line 6 | Delete "Cd" and insert --$C_d$-- |
| Column 14, Line 6 | Delete "t>t5," and insert --$t>t_5$,-- |
| Column 14, Line 7 | Delete "Vout" and insert --$V_{out}$-- |
| Column 14, Line 13 | Delete "Cn" and insert --$C_n$-- |
| Column 14, Line 16 | Delete "Vout" and insert --$V_{out}$-- |
| Column 14, Line 17 | Delete "Vth," and insert --$V_{th}$,-- |
| Column 14, Line 18 | Delete "Vout" and insert --$V_{out}$-- |
| Column 14, Line 19 | Delete "Vtl," and insert --$V_{tl}$,-- |
| Column 14, Line 24 | Delete "Vout" and insert --$V_{out}$-- |
| Column 14, Line 25 | Delete "Cn" and insert --$C_n$-- |
| Column 14, Line 28 | Delete "Vout+2Vj," and insert --$V_{out}$+2Vj,-- |
| Column 14, Line 28 | Delete "Cn" and insert --$C_n$-- |
| Column 14, Line 34 | Delete "Vout" and insert --$V_{out}$-- |

| Column 14, Line 35 | Delete "Vr." and insert --$V_r$.-- |
| Column 14, Line 37 | Delete "Cn," and insert --$C_n$,-- |
| Column 14, Line 38 | Delete "Cn" and insert --$C_n$-- |
| Column 14, Line 41 | Delete "Cn*G" and insert --$C_n$*G-- |
| Column 14, Line 43 | Delete "Cn*G" and insert --$C_n$*G-- |
| Column 14, Line 43 | Delete "Dr" and insert --$D_r$-- |
| Column 14, Line 45 | Delete "Dr" and insert --$D_r$-- |
| Column 14, Line 48 | Delete "Vout" and insert --$V_{out}$-- |
| Column 14, Line 49 | Delete "Vth" and insert --$V_{th}$-- |
| Column 14, Line 50 | Delete "Vtl," and insert --$V_{tl}$,-- |
| Column 15, Line 2 | Delete "Vout" and insert --$V_{out}$-- |

In the Claims:

| Column 15, Line 54, Claim 2 | Delete "Vth" and insert --$V_{th}$-- |
| Column 15, Line 55, Claim 2 | Delete "Vtl." and insert --$V_{tl}$.-- |
| Column 15, Line 58, Claim 3 | Delete "Vtl," and insert --$V_{tl}$,-- |
| Column 15, Line 60, Claim 3 | Delete "Vth." and insert --$V_{th}$.-- |
| Column 17, Line 11, Claim 20 | Delete "Vth" and insert --$V_{th}$-- |
| Column 17, Line 12, Claim 20 | Delete "Vtl." and insert --$V_{tl}$.-- |
| Column 17, Line 15, Claim 21 | Delete "Vtl," and insert --$V_{tl}$,-- |
| Column 17, Line 17, Claim 21 | Delete "Vth." and insert --$V_{th}$.-- |